(12) United States Patent
Yin et al.

(10) Patent No.: US 8,809,134 B2
(45) Date of Patent: Aug. 19, 2014

(54) SEMICONDUCTOR STRUCTURE AND METHOD FOR MANUFACTURING THE SAME

(75) Inventors: Haizhou Yin, Poughkeepsie, NY (US); Wei Jiang, Beijing (CN)

(73) Assignee: The Institute of Microelectronics Chinese Academy of Science, Beijing (CN)

( * ) Notice: Subject to any disclaimer, the term of this patent is extended or adjusted under 35 U.S.C. 154(b) by 0 days.

(21) Appl. No.: 13/640,735

(22) PCT Filed: May 17, 2012

(86) PCT No.: PCT/CN2012/000680
§ 371 (c)(1),
(2), (4) Date: Oct. 12, 2012

(87) PCT Pub. No.: WO2012/171323
PCT Pub. Date: Dec. 20, 2012

(65) Prior Publication Data
US 2013/0307034 A1   Nov. 21, 2013

(30) Foreign Application Priority Data

Jun. 13, 2012 (CN) .......................... 2011 1 0158857

(51) Int. Cl.
*H01L 21/00* (2006.01)
*H01L 21/336* (2006.01)
*H01L 29/66* (2006.01)
*H01L 21/02* (2006.01)

(52) U.S. Cl.
USPC ............ 438/151; 438/266; 257/330; 257/382

(58) Field of Classification Search
USPC ......... 438/151, 199, 203, 233, 266, 303, 283; 257/330, 382
See application file for complete search history.

(56) References Cited

U.S. PATENT DOCUMENTS 6,063,681 A * 5/2000 Son .............................. 438/303
6,451,693 B1 * 9/2002 Woo et al. ..................... 438/682

(Continued)

FOREIGN PATENT DOCUMENTS

CN          101170066 A     4/2008
JP          2002-368007 A   12/2002

OTHER PUBLICATIONS

Machine translation of Japanese Patent Application No. 2001-164750 on Aug. 9, 2013.*

*Primary Examiner* — Long K Tran
*Assistant Examiner* — Dzung Tran

(57) ABSTRACT

A method of manufacturing a semiconductor structure, which comprises the steps of: providing a substrate, forming a fin on the substrate, which comprises a central portion for forming a channel and an end portion for forming a source/drain region and a source/drain extension region; forming a gate stack to cover the central portion of the fin; performing light doping to form a source/drain extension region in the end portion of the fin; forming a spacer on sidewalls of the gate stack; performing heavy doping to form a source/drain region in the end portion of the fin; removing at least a part of the spacer to expose at least a part of the source/drain extension region; forming a contact layer on an upper surface of the source/drain region and an exposed area of the source/drain extension region. Correspondingly, the present invention also provides a semiconductor structure. By forming a thin contact layer in the source/drain extension region, the present invention can not only effectively reduce the contact resistance of the source/drain extension region, but also effectively control the junction depth of the source/drain extension region by controlling the thickness of the contact layer, thereby suppressing the short channel effect.

13 Claims, 15 Drawing Sheets

(56) References Cited

U.S. PATENT DOCUMENTS

| | | |
|---|---|---|
| 6,610,565 B2 | 8/2003 | Kim et al. |
| 6,936,515 B1 * | 8/2005 | Ogawa et al. ................ 438/266 |
| 2003/0183881 A1 * | 10/2003 | Lee et al. ..................... 257/382 |
| 2004/0142515 A1 * | 7/2004 | Assaderaghi et al. ........ 438/149 |
| 2007/0166937 A1 * | 7/2007 | Adetutu et al. ............... 438/300 |
| 2007/0267691 A1 * | 11/2007 | Chen et al. ................... 257/330 |

* cited by examiner

SEMICONDUCTOR STRUCTURE AND METHOD FOR MANUFACTURING THE SAME

CROSS REFERENCE

This application is a National Stage Application of, and claims priority to, PCT Application No. PCT/CN2012/000680, filed on May 17, 2012, entitled "A Semiconductor Structure and Manufacturing Method thereof", which claims priority to Chinese Application No. 201110158857.2, filed on Jun. 13, 2011. Both the PCT application and the Chinese application are incorporated herein by reference in their entireties.

FIELD OF THE INVENTION

The present invention relates to semiconductor manufacturing technology, and in particular to a semiconductor structure and a method for manufacturing the same.

BACKGROUND OF THE INVENTION

The Fin Field Effect Transistor (Fin FET) is a technology newly emerged in recent years, which makes semiconductor devices have smaller scale and higher performance FIGS. 1(a) to 1(c) are the three-dimensional schematic drawing, the top view and the sectional view along line BB' of the Fin Field Effect Transistor in the prior art, respectively. As shown in the figures, the fin 106 made of a semiconductor material is located on the insulating layer 102; the fin 106 comprises a middle portion for forming a channel and end portions for forming source/drain regions 110b and source/drain extension regions 110a; a gate stack covers the middle portion of the fin 106 and extends along a direction vertical to the fin 106, wherein, the gate stack comprises a gate dielectric layer 200, a gate 202 and a hard mask 204; spacers 206 surround the sidewalls of the gate stack and are located above the source/drain extension regions 110a; there is a contact layer 108 on the upper surface of the source/drain regions 110b so as to reduce the contact resistance of the source/drain regions 110b and to improve the performance of the Fin Field Effect Transistor.

In order to suppress short channel effect, the source/drain extension regions needs to be formed with a smaller thickness. In the prior art, the source/drain extension regions are usually formed on both sides of the gate stack by means of ion implantation. There are the following problems when the source/drain extension regions are formed by ion implantation:

1) after performing the ion implantation, the source/drain extension regions need to be annealed to activate the doping ions in the source/drain extension regions, but the annealing can only activate a certain number of doping ions, so there is limitation to the electric conductivity of the source/drain extension regions; and 2) since the source/drain extension regions have a smaller thickness, during ion implantation, such aspects as the energy and angle of ion implantation need to be controlled, so the process is complicated and not easily controllable.

Therefore, how to further reduce the contact resistance of the source/drain extension regions in the Fin Field Effect Transistor and meanwhile control the junction depth of the source/drain extension regions by a simple process becomes a burning question.

SUMMARY OF THE INVENTION

The object of the present invention is to provide a semiconductor structure and the manufacturing method thereof, and by forming a thin contact layer in the source/drain extension region, the electrical conductivity of the source/drain extension region can be improved, meanwhile, the junction depth of the source/drain extension region can also be effectively controlled by controlling the thickness of the contact layer, thereby suppressing the short channel effect.

According to one aspect of the present invention, a method of manufacturing a semiconductor structure is provided, which comprises the steps of:

a) providing a substrate, forming a fin on the substrate, which comprises a central portion for forming a channel and an end portion for forming a source/drain region and a source/drain extension region;

b) forming a gate stack to cover the central portion of the fin; performing light doping to form a source/drain extension region in the end portion of the fin;

forming a spacer on the sidewall of the gate stack;

performing heavy doping to form a source/drain region in the end portion of the fin;

c) removing at least a part of the spacer to expose at least a part of the source/drain extension region; and d) forming a contact layer on an upper surface of the source/drain region and an exposed area of the source/drain extension region.

According to another aspect of the present invention, semiconductor structure is provided, which comprises a fin, source/drain region, a source/drain extension region and a gate stack, wherein, the fin has a central channel portion and end portions including a source/drain region and a source/drain extension region, the end portions abut first opposite sides of the central channel portion;

the gate stack covers the central channel portion and extends outside from second opposite sides of the central channel portion; and there is a contact layer on an upper surface of the source/drain region and at least a part of the source/drain extension region.

It shall be noted that in a preferred solution of the present invention, the first sides are substantially perpendicular to the second sides. The term "substantially perpendicular" indicates the standard that can be achieved by the semiconductor technology is taken into account, that is, taking into account the error within a range allowable by the state of the art of semiconductor.

Compared to the prior art, the present invention has the following advantages: a thin contact layer is formed in the source/drain extension region, so compared to the conventional method of forming source/drain extension region through ion implantation, the present invention can not only more effectively reduce the contact resistance of the source/drain extension region and improve the electrical conductivity thereof, but also effectively control the junction depth of the source/drain extension region by controlling the thickness of the contact layer, thereby suppressing the short channel effect.

BRIEF DESCRIPTION OF THE DRAWINGS

Other features, objects and advantages of the present invention will become more apparent through reading the detailed descriptions of the non-restrictive embodiments made with reference to the following drawings, wherein.

DETAILED DESCRIPTION OF THE PREFERRED EMBODIMENTS

The embodiments of the present invention will be described in detail below, and examples of the embodiments are shown in the figures. The embodiments described below with reference to the drawings are exemplary, which are only for illustrating the present invention instead of limiting the present invention.

The following disclosure provides a plurality of different embodiments or examples to achieve different structures of the present invention. To simplify the disclosure of the present invention, description of the components and arrangements of specific examples is given below. Of course, they are only illustrative and not intended to limit the present invention. Moreover, in the present invention, reference numbers and/or letters may be repeated in different embodiments. Such repetition is for the purposes of simplification and clearness, and does not denote the relationship between respective embodiments and/or arrangements being discussed. In addition, the present invention provides various examples for specific process and materials. However, it is obvious for a person of ordinary skill in the art that other process and/or materials may alternatively be utilized. It shall be noted that the components shown in the figures are not necessarily drawn to scale. Descriptions about the known components and processing technology are omitted in the present invention so as not to unnecessarily limit the invention.

Figure 1A:
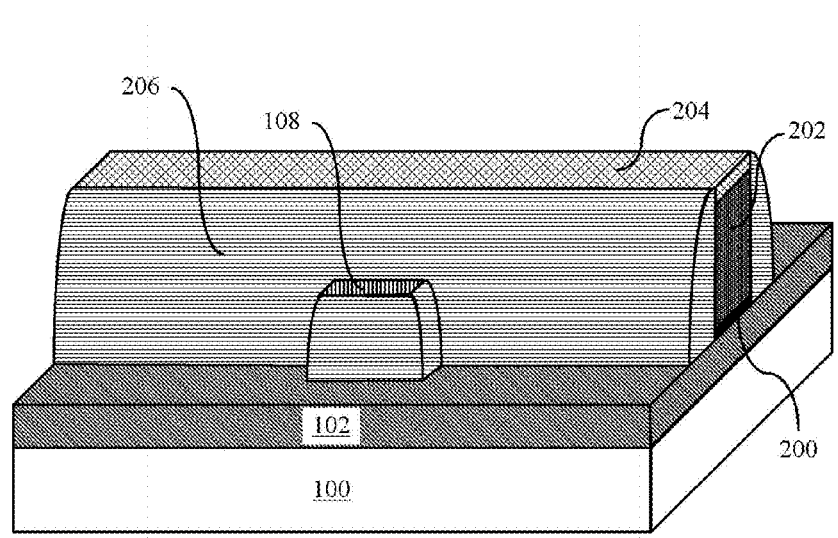
FIGS. 1(a), 1(b) and 1(c) are respectively the three-dimensional schematic drawing, the top view and the sectional view along line BB' of the Fin Field Effect Transistor in the prior art.
Figure 1B:
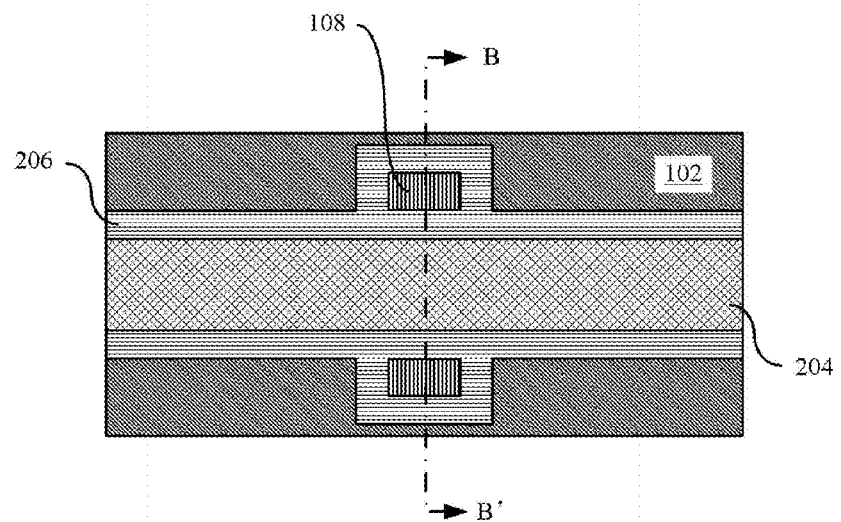
Figure 1C:
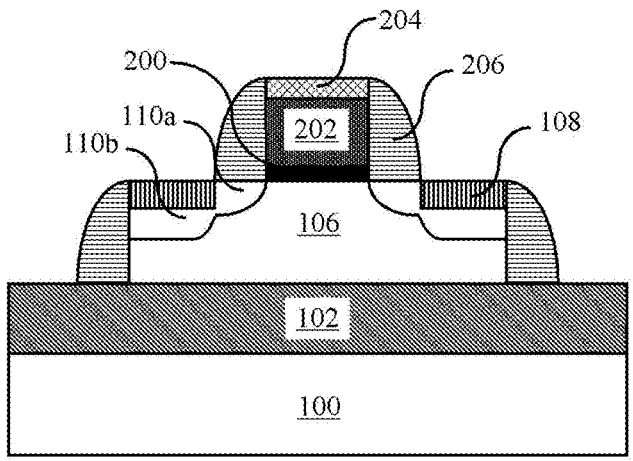
Figure 2:
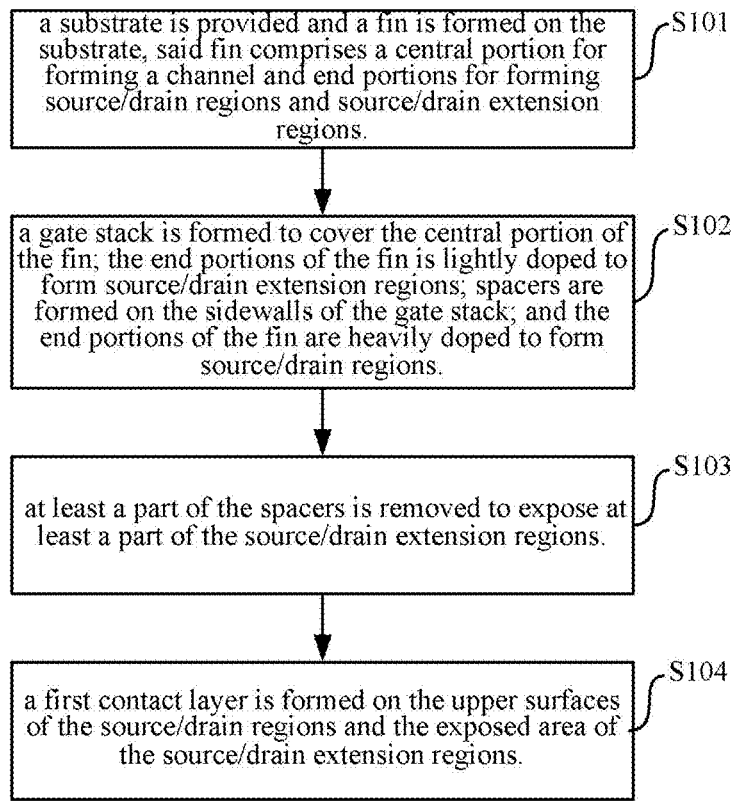
FIG. 2 is a flow chart of the semiconductor structure manufacturing method according to one embodiment of the present invention.

According to one aspect of the present invention, a method of manufacturing a semiconductor structure is provided, as shown in FIG. 2. Now the method of forming a semiconductor structure as shown in FIG. 2 will be described in detail through an embodiment of the present invention with reference to FIGS. 2(a) to 9(b).

Referring to FIG. 2, FIGS. 3(a)-3(c) and FIGS. 4(a)-4(d), in step S101, a substrate is provided and a fin 106 is formed on the substrate, the fin 106 comprises a central portion 106b for forming a channel and end portions 106a for forming source/drain regions and source/drain extension regions.

Figure 3A:
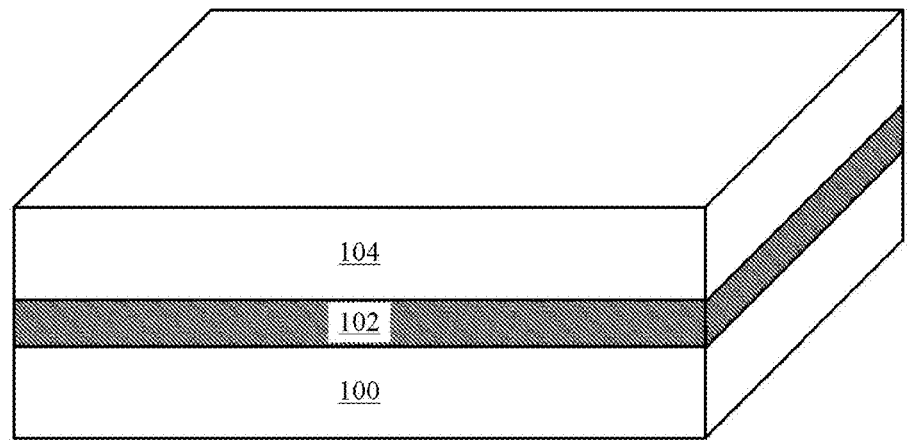
FIGS. 3(a), 3(b) and 3(c) are respectively the three-dimensional schematic drawing, the top view and the sectional view along line AA' of the substrate formed according to the flow shown in FIG. 2 according to one embodiment of the present invention.
Figure 3B:
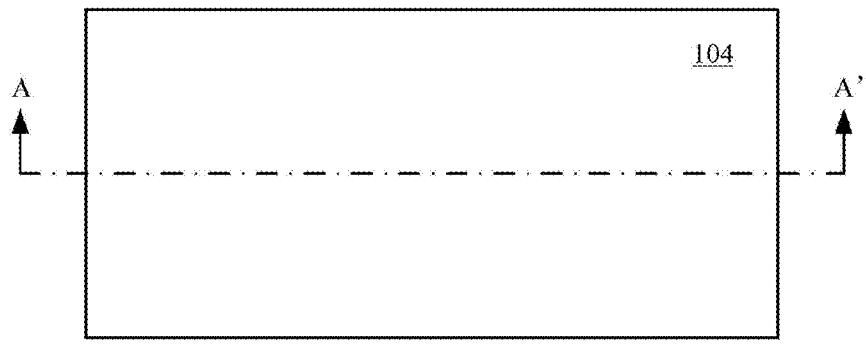
Figure 3C:
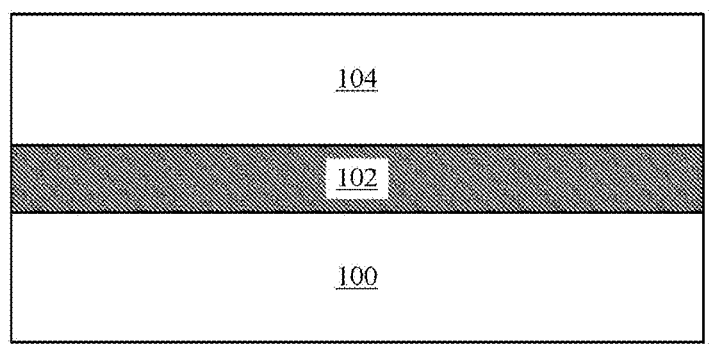
Figure 4A:
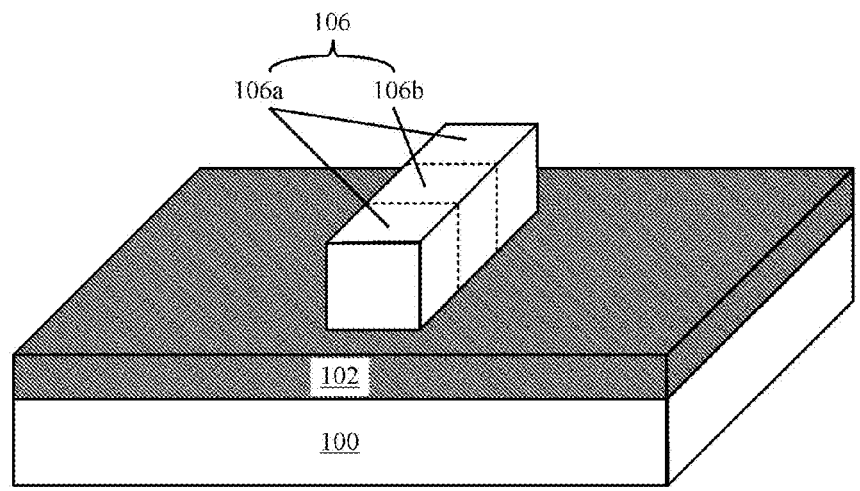
FIGS. 4(a), 4(b), 4(c) and 4(d) are respectively the three-dimensional schematic drawing, the top view, the sectional view along line AA' and the sectional view along line BB' after forming the fin according to the flow shown in FIG. 2 according to one embodiment of the present invention.
Figure 4B:
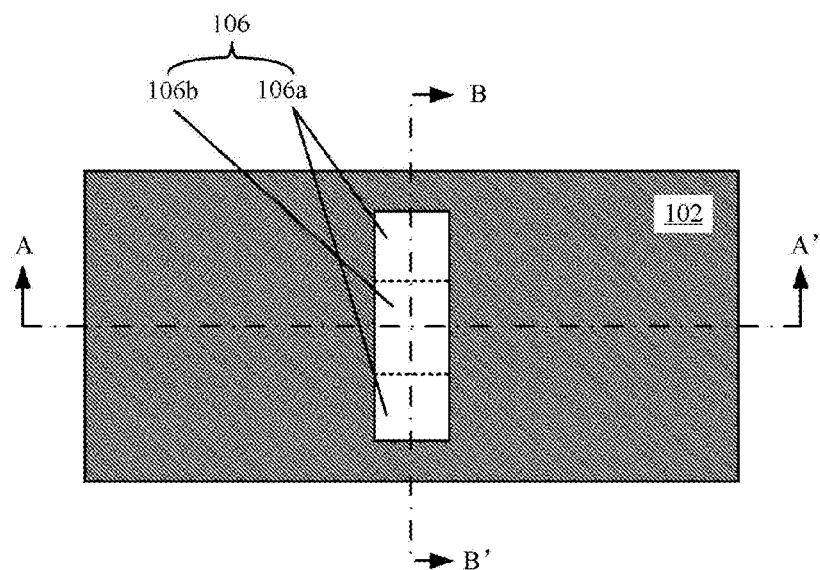
Figure 4C:
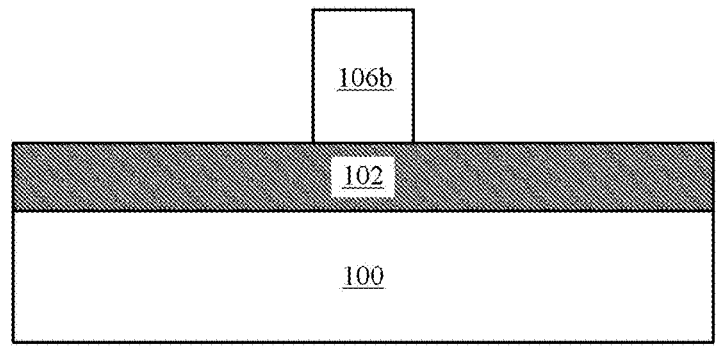
Figure 4D:
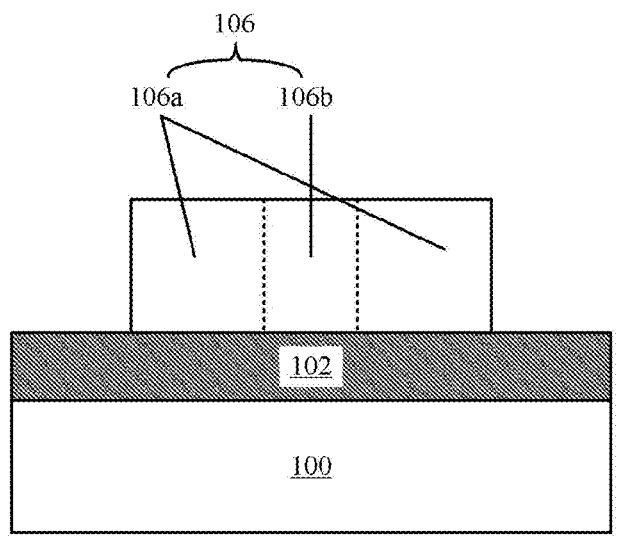
Figure 5A:
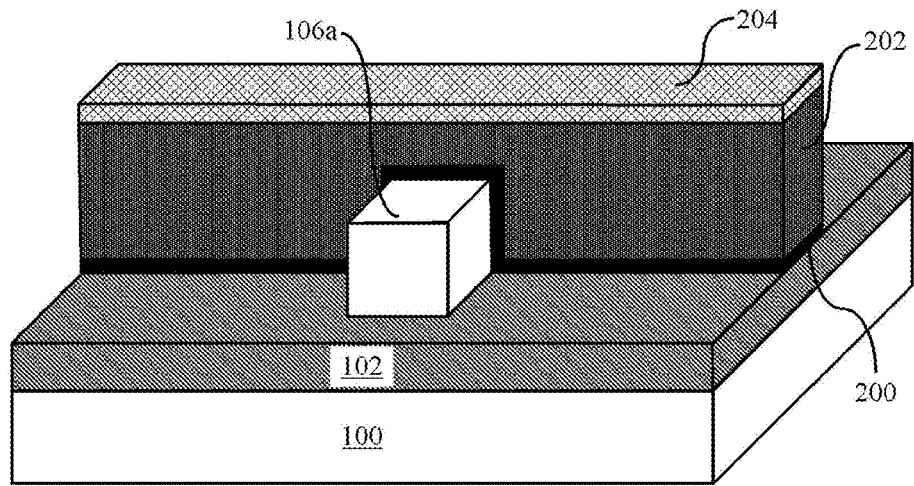
FIGS. 5(a), 5(b), 5(c) and 5(d) are respectively the three-dimensional schematic drawing, the top view, the sectional view along line AA' and the sectional view along line BB' after forming the gate stack according to the flow shown in FIG. 2 according to one embodiment of the present invention.
Figure 5B:
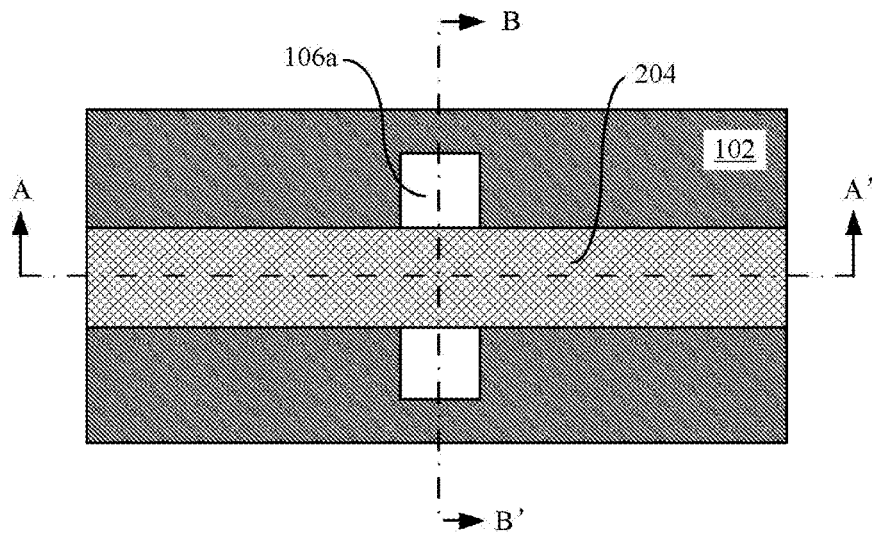
Figure 5C:
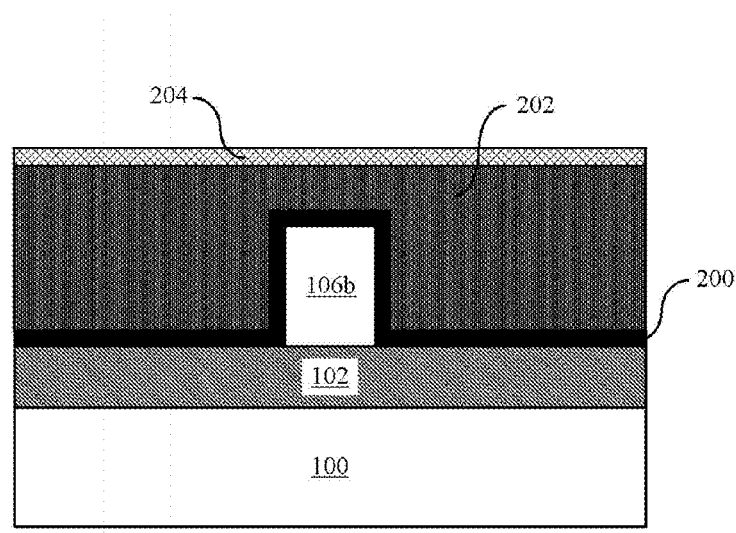
Figure 5D:
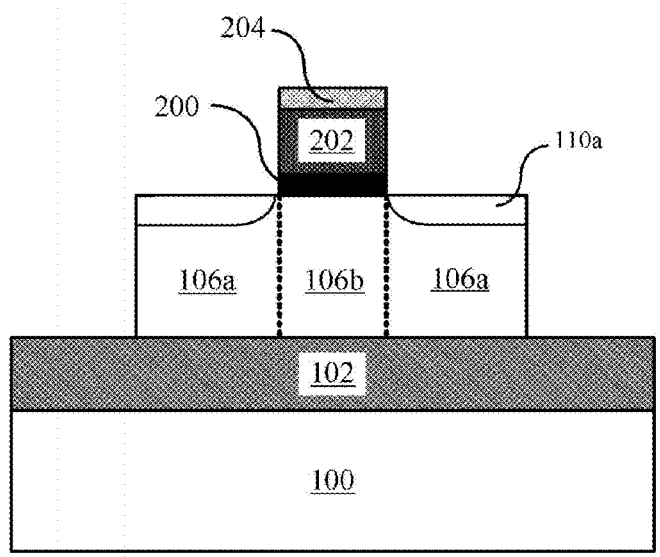

Specifically, first, as shown in FIGS. 3(a), 3(b) and 3(c), a SOI (Silicon-On-Insulator) substrate is provided, which comprises a first semiconductor layer 100, an insulating layer 102 on the first semiconductor layer 100, and a second semiconductor layer 104 on the insulating layer 102.

Wherein, the first semiconductor layer 100 is monocrystalline silicon, while in other embodiments, the first semiconductor layer 100 may also include other basic semiconductors such as germanium. Alternatively, the first semiconductor layer 100 may also include a compound semiconductor, such as silicon carbide, gallium arsenide, indium arsenide or indium phosphide. Typically, the thickness of the first semiconductor layer 100 can be, but not limited to, about several hundred microns, for example, the thickness can be within a range from 0.4 nm to 0.8 nm.

The insulating layer 102 can be $SiO_2$, silicon nitride or any other appropriate insulating material, typically, the thickness of the insulating layer 102 is within a range from 200 nm to 300 nm.

The second semiconductor layer 104 can be any one of the semiconductors included in the first semiconductor layer 100. In this embodiment, the second semiconductor layer 104 is monocrystalline silicon. In other embodiments, the second semiconductor layer 104 may also include other basic semiconductors or compound semiconductors. The thickness of the second semiconductor layer 104 is within a range from 50 nm to 100 nm. Preferably, the thickness of the second semiconductor layer 104 is equal to the height of the fin to be formed in the subsequent steps. In the text below, the subsequent semiconductor manufacturing process is described by using the example that the second semiconductor layer 104 is a silicon layer.

Next, as shown in FIGS. 4(a), 4(b), 4(c) and 4(d), a mask (not shown) is deposited on the silicon layer 104 and is patternized to expose the area of the silicon layer 104 that is to be removed in the subsequent manufacturing processes, wherein the mask can be any conventional mask, such as a photoresist mask that can be easily patternized using conventional technology or other similar masks; then the exposed part of the silicon layer 104 is removed by means of such process as dry etching and/or wet etching so as to form the fin 106; finally, the mask remaining on the top of the fin 106 is removed. As shown by the dashed lines in FIGS. 4(a), 4(b) and 4(d), the fin 106 comprises a central portion 106b and end portions 106a located on both sides of the central portion 106b, wherein the central portion 106b will be used for forming the channel of the semiconductor structure in the subsequent manufacturing processes, and the end portions 106a will be used for forming the source/drain regions and source/drain extension regions of the semiconductor structure.

Referring to FIG. 2, FIGS. 5(a)-5(d) and FIGS. 6(a)-6(c), in step S102, a gate stack is formed to cover the central portion 106b of the fin 106; the end portions 106a of the fin is lightly doped to form source/drain extension regions 110a;

spacers 206 are formed on the sidewalls of the gate stack; and the end portions 106a of the fin are heavily doped to form source/drain regions 110b.

Specifically, as shown in FIGS. 5(a), 5(b), 5(c) and 5(d), a gate dielectric material layer (not shown) is deposited on the fin 106 and the insulating layer 102, a gate material layer (not shown) is deposited on the gate dielectric material layer, and a hard mask material layer (not shown) is deposited on the gate material layer, wherein, the gate dielectric material layer may use hafnium based material, such as one of $HfO2$, $HfSiO$, $HfSiON$, $HfTaO$, $HfTiO$ and $HfZrO$ or combinations thereof, or one of alumina, lanthana, zirconia, silicon oxide and silicon oxynitride or combinations thereof and a combination of hafnium based material therewith, and the thickness thereof can be 1 nm-5 nm, for example, 2 nm or 4 nm. The gate material layer can be a metal, and the thickness thereof can be 50 nm-100 nm, for example, 60 nm, 70 nm, 80 nm or 90 nm. The hard mask material layer can be silicon nitride or silicon dioxide or combinations thereof, or it can be other suitable materials, preferably materials different from those used for forming the spacers 206 (see FIGS. 6(a)-6(c)) in the subsequent steps.

The hard mask material layer is patternized, then, using the insulating layer 102 as an etching stop layer, the hard mask material layer, gate material layer and gate dielectric material layer are etched by means of methods like dry etching and/or wet etching to expose the insulating layer 102 and the end portions 106a of the fin 106, thereby forming a gate stack consisting of a gate dielectric layer 200, a gate 202 and a hard mask 204, wherein, the gate stack covers the central portion 106b of the fin 106 and extends in a direction substantially vertical to the fin 106, and the end portions 106a of the fin 106 are located on both sides of the gate stack.

After forming the gate stack, the end portions 106a of the fin 106 on both sides of the gate stack are lightly doped by implanting a P-type or N-type dopant with a low doping concentration so as to form the source/drain extension regions 110a. With respect to a P-type device, the dopant of the source/drain extension regions 110a can be B or In, with respect to an N-type device, the dopant of the source/drain extension regions 110a can be P or As.

Figure 6A:
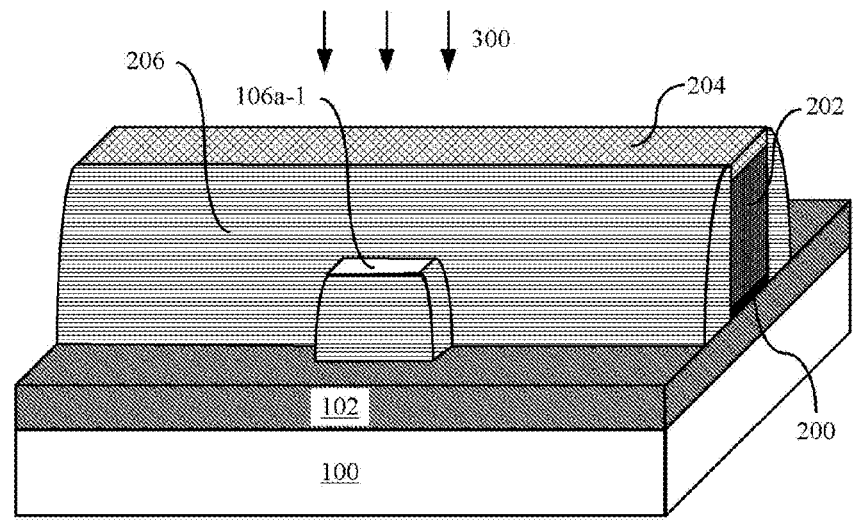
FIGS. 6(a), 6(b) and 6(c) are respectively the three-dimensional schematic drawing, the top view and the sectional view along line BB' after forming the spacer according to the flow shown in FIG. 2 according to one embodiment of the present invention.
Figure 6B:
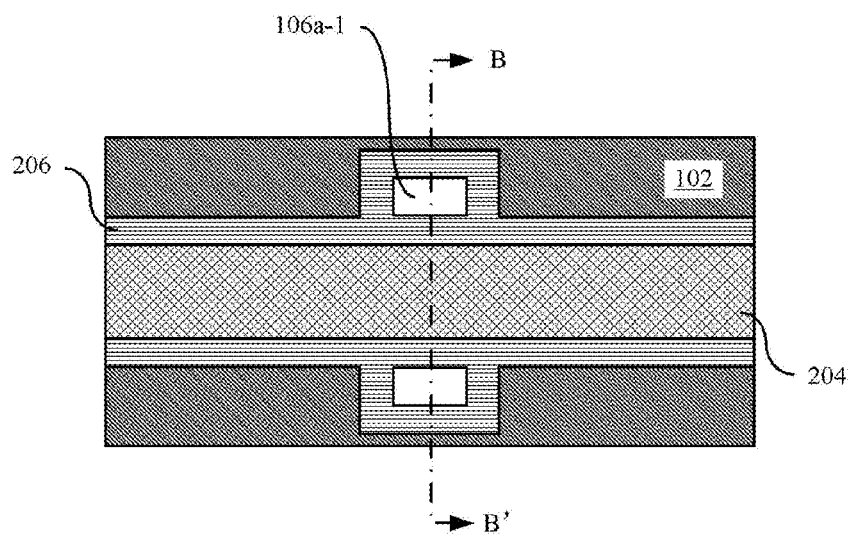
Figure 6C:
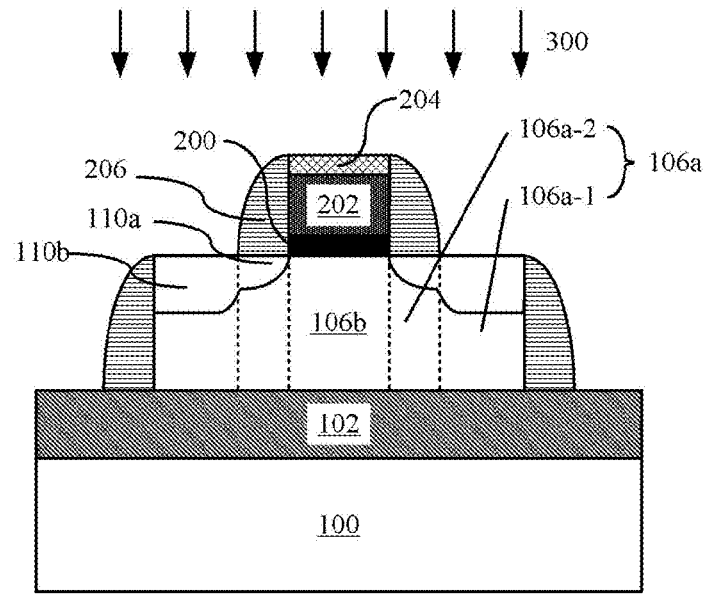
Figure 7A:
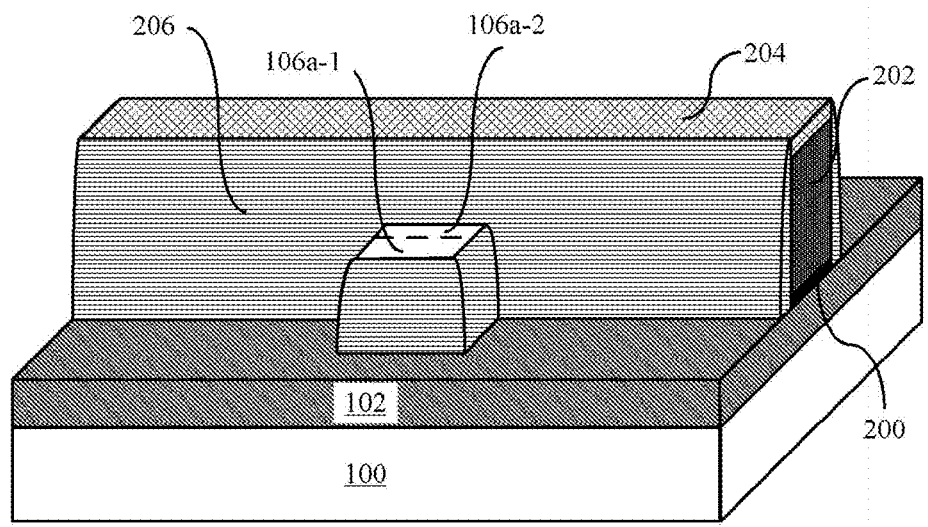
FIGS. 7(a), 7(b) and 7(c) are respectively the three-dimensional schematic drawing, the top view and the sectional view along line BB' after removing part of the spacer according to the flow shown in FIG. 2 according to another embodiment of the present invention.
Figure 7B:
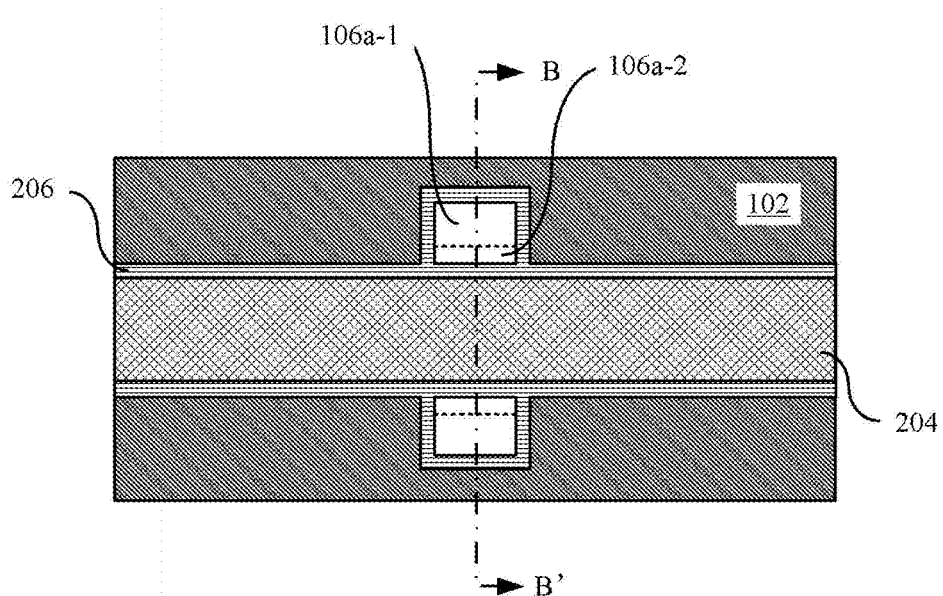
Figure 7C:
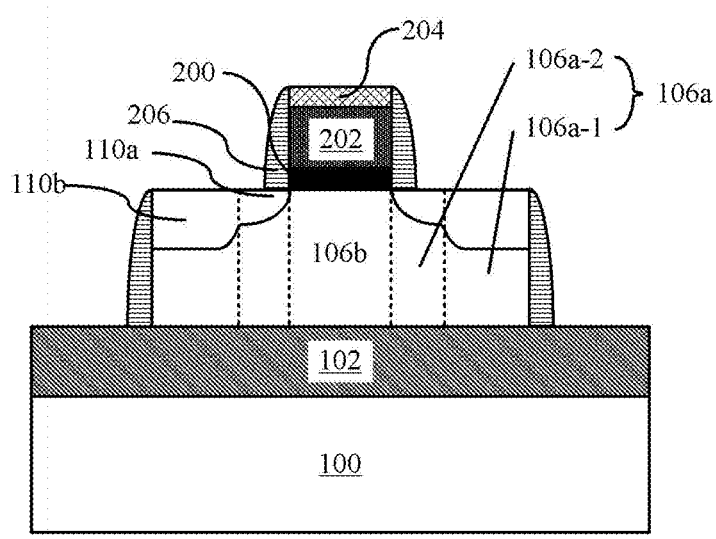

Then, as shown in FIGS. 6(a), 6(b) and 6(c), spacers 206 are formed to surround the gate stack and the fin 106. The spacers 206 can be composed by silicon nitride, silicon oxide, silicon oxynitride, silicon carbide and combinations thereof, and/or by other appropriate materials. Preferably, the material of the spacers 206 is different from that of the hard mask 204 so as to prevent etching of the hard mask 204 when etching the spacers 206 in the subsequent steps, which will lead to destroy to the gate 202. The spacers 206 may have a multi-layered structure. The spacers 206 can be formed by deposition and etching, and the thickness thereof is within a range from 10 nm to 100 nm, for example, 30 nm, 50 nm or 80 nm. The spacers 206, after its formation, covers a part of the end portions 106a of the fin 106 while exposing the rest of the end portions 106a, wherein, the exposed area of the end portions 106a will be used for forming the source/drain regions 110b, and the area covered by the spacers 206 will be used for forming the source/drain extension regions 110a. In the text below, the area in the end portions 106a for forming the source/drain regions 110b is called a first area 106a-1 (see FIGS. 6(a), 6(b) and 6(c)), and the area in the end portions 106a for forming the source/drain extension regions 110a is called a second area 106a-2 (see FIG. 6(c)).

Next, along the direction shown by arrow 300 in FIGS. 6(a) and 6(c), the first area 106a-1 of the fine 106 that is exposed on both sides of the spacers 206 is heavily doped by implanting a P-type or N-type dopant of a high doping concentration using the spacers 206 as a mask, thus forming the source/drain regions 110b. For example, with respect to a P-type device, the dopant of the source/drain regions 110b can be B or In, and with respect to an N-type device, the dopant of the source/drain region 110b can be P or As. Then, the semiconductor structure is annealed to activate the doping in the source/drain regions 110b. The annealing can include rapid annealing, peak annealing and other appropriate annealing methods.

Referring to FIG. 2, FIGS. 7(a)-7(c), in step S103, at least a part of the spacers 206 is removed to expose at least a part of the source/drain extension regions 110a.

Specifically, a part or all of the spacers 206 can be removed by means of wet etching and/or dry etching so as to expose a part or all of the source/drain extension regions 110a under the spacers 206. Wherein, the wet etching uses tetramethylammonium hydroxide (TMAH), potassium hydroxide (KOH) or other solution suitable for etching; the dry etching uses such hydroxides of carbon as sulphur hexafluoride ($SF_6$), hydrogen bromide (HBr), hydrogen iodide (HI), chlorine, argon, helium, methane (and methyl chloride), acetylene and ethylene and combinations thereof, and/or other appropriate materials.

If the material of the gate 202 in the gate stack is Si or metal, in order to avoid the difficulty of separating the metal for forming the contact layer 108 (see FIGS. 8(a)-8(d)) from the metal of the gate in the subsequent process and thereby influencing the size of the gate stack, it is inadvisable to remove the spacers 206 completely; if the material of the gate 202 in the gate stack does not react with the metal forming the contact layer 108, then the gate stack does not need to be particularly protected, and the spacers 206 can be removed completely to maximally expose the source/drain extension regions 110a and increase the area of the source/drain extension regions 110a that reacts with the metal, thereby further reducing the contact resistance of the source/drain extension regions 110a.

Referring to FIG. 2 and FIGS. 8(a)-8(d), in step S104, the contact layer 108 is formed on the upper surfaces of the source/drain regions 110b and the exposed area of the source/drain extension regions 110a.

Specifically, a thin metal layer (not shown) is deposited to cover the fin 106 and the gate stack, then an annealing operation is performed to make the metal layer react with the exposed area of the fin 106 to form a contact layer 108, that is, the contact layer 108 is formed on the upper surface of the source/drain regions 110b and the upper surface of part or all of the source/drain extension regions 110a (in this embodiment, the fin is monocrystalline silicon, so the contact layer is named metal silicide layer hereinafter). The thickness of the metal layer is preferably smaller than 3 nm, and after annealing, the thickness of the metal silicide layer 108 formed by the metal layer reacting with the fin 106 is smaller than 7 nm. Finally, the un-reacted metal layer is selectively removed.

When the thickness of the metal layer is smaller than 3 nm, the material of the metal layer is preferably one of Co, Ni and NiPt or combinations thereof. If the material of the metal layer is NiPt, the content of Pt in NiPt is smaller than 5%. When the above-mentioned materials are used for the metal layer, the formed metal silicide layer 108 is one of $CoSi_2$, NiSi and $Ni(Pt)Si_{2-y}$, or combinations thereof, and it has a thickness smaller than 7 nm and has a certain thermal stability, that is, a low resistance is maintained under a high temperature (e.g. 850° C.), thus helping to alleviate the increase in the resistance of the metal silicide layer 108 caused by high temperature annealing in the subsequent semiconductor structure manufacturing process and maintain the good performance of the semiconductor structure.

Figure 9A:
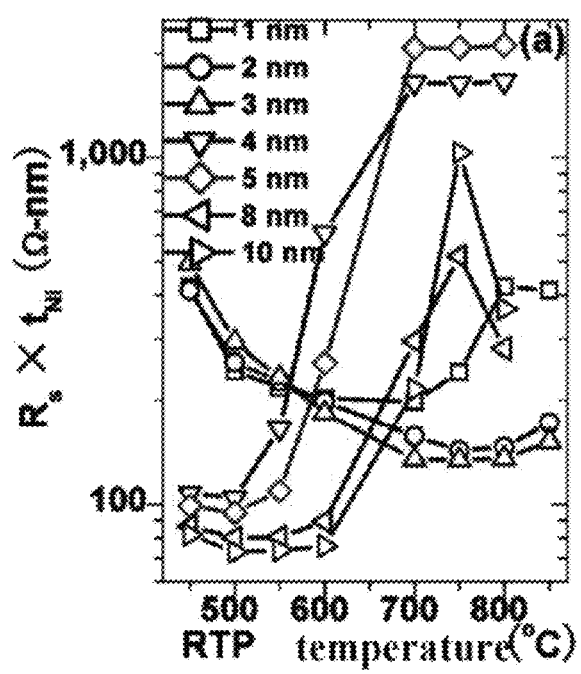
FIG. 9(a) shows the resistance of the nickel silicides formed by depositing Ni layers of different thickness at different temperatures.
Figure 9B:
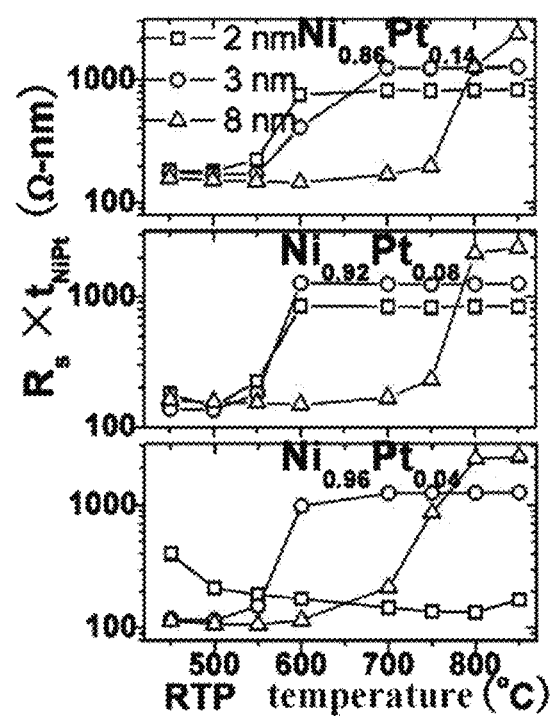
FIG. 9(b) shows the resistance of the nickel platinum silicides formed by depositing NiPt layers of different thickness and components at different temperatures.

In order to explain the relation between the thickness of the metal layer and the stability of the metal silicide layer 108, reference can be made to FIGS. 9(a) and 9(b). Wherein, FIG. 9(a) shows the resistance of the nickel silicides formed by depositing Ni layers of different thickness at different temperatures, the x-coordinate represents the temperature of performing the rapid thermal processing (PRT), the y-coordinate represents the resistance of the nickel silicides, and the different curves represent the Ni layers of different thickness deposited when forming the nickel silicides. FIG. 9(a) shows that when the temperature of the rapid thermal processing is above 700° C., the deposited metal Ni layer has a thickness of 2-3 nm, and the resistance of the formed nickel silicide is relatively low. FIG. 9(b) shows the resistance of the nickel platinum silicides formed by depositing NiPt layers of different thickness at different temperatures. FIG. 9(b) consists of an upper figure, a middle figure and a lower figure, in which the x-coordinates all represent the temperature of performing the rapid thermal processing, the y-coordinates represent the resistance of the nickel platinum silicides; and the different curves in the upper figure represent the NiPt layers of different thickness when the metal layer is NiPt, the content of Ni is 86%, the content of Pt is 14%; the different curves in the middle figure represent the NiPt layers of different thickness when the metal layer is NiPt, the content of Ni is 92%, the content of Pt is 8%; the different curves in the lower figure represent the NiPt layers of different thickness when the metal layer is NiPt, the content of Ni is 96%, the content of Pt is 4%. FIG. 9(b) shows that when the temperature of the rapid thermal processing is above 700° C., the content of Pt in the deposited NiPt layer is 4%, and the NiPt layer has a thickness of 2 nm, the resistance of the formed nickel platinum silicides is relatively low, i.e. the thermal stability thereof is good.

After completion of the above-mentioned steps, in the semiconductor substrate, there is a very thin metal silicide layer 108 on the upper surface of part or all of the source/drain extension regions 110a. Compared to the conventional source/drain extension regions 110a formed by ion implantation, the metal silicide layer 108 has a larger area, so the source/drain extension regions 110a can have a lower contact resistance, thereby effectively improving the electrical conductivity of the semiconductor structure. Moreover, by controlling the thickness of the metal layer, the thickness of the metal silicide layer 108 can be controlled, thus the junction depth of the source/drain extension regions 110a can be effectively controlled to form a thinner source/drain extension region 110a, as a result, the short channel effect can be suppressed. Compared to the process of forming a thinner source/drain extension regions 110a by controlling the energy, angle, etc. of ion implantation, the process of controlling the metal layer thickness is easier.

Correspondingly, according to the above manufacturing method of a semiconductor structure, the present invention also provides a semiconductor structure, and now the semiconductor structure will be described with reference to FIGS. 8(a)-8(d). FIGS. 8(a)-8(d) are respectively the three-dimensional schematic drawing, the top view and the sectional view along line BB' of the finally formed semiconductor structure according to the flow shown in FIG. 2 according to one embodiment of the present invention.

Referring to FIGS. 8(a), 8(b), 8(c) and 8(d), in this embodiment, the semiconductor structure comprises a fin 106, source/drain regions 110b, source/drain extension regions 110a, a gate stack and spacers 206, wherein the fin 106 comprises a central channel portion 106b and end portions 106a comprising the source/drain regions 110b and the source/drain extension regions 110a. The end portions 106a abut the first opposite sides of the central channel portion 106b. The gate stack covers the central channel portion 106b and extends outside along the second opposite sides of the central channel portion 106b and is vertical to the fin 106. The gate stack comprises a gate dielectric layer 200, a gate 202 and a hard mask 204. The gate dielectric layer 200 is located on the central channel portion 106b, the gate 202 is located on the gate dielectric layer 200, and the hard mask 204 is located on the gate 202. The spacers 206 are located on the sidewalls of the gate stack and cover part of the source/drain extension regions 110a. There is a contact layer 10 on the upper surfaces of the source/drain regions 110b and the source/drain extension regions 110a that is not covered by the spacers 206, and the thickness thereof is smaller than 7 nm.

Figure 8A:
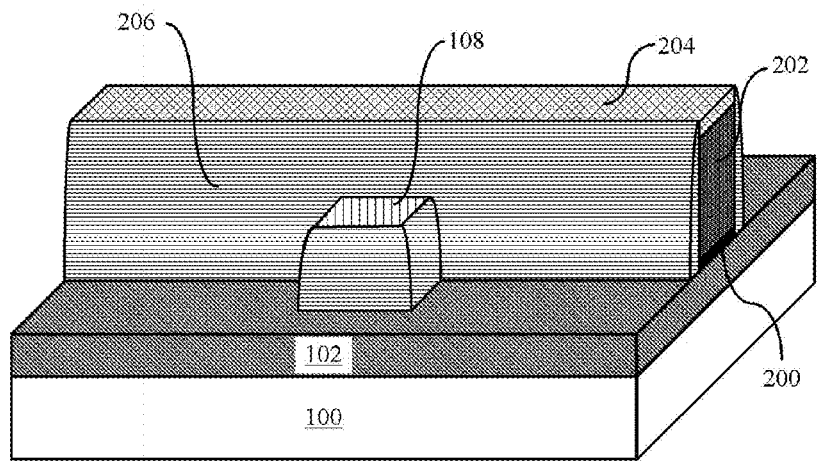
FIGS. 8(a), 8(b), 8(c) and 8(d) are respectively the three-dimensional schematic drawing, the top view and the sectional view along line BB' after forming the contact layer according to the flow shown in FIG. 2 according to another embodiment of the present invention.
Figure 8B:
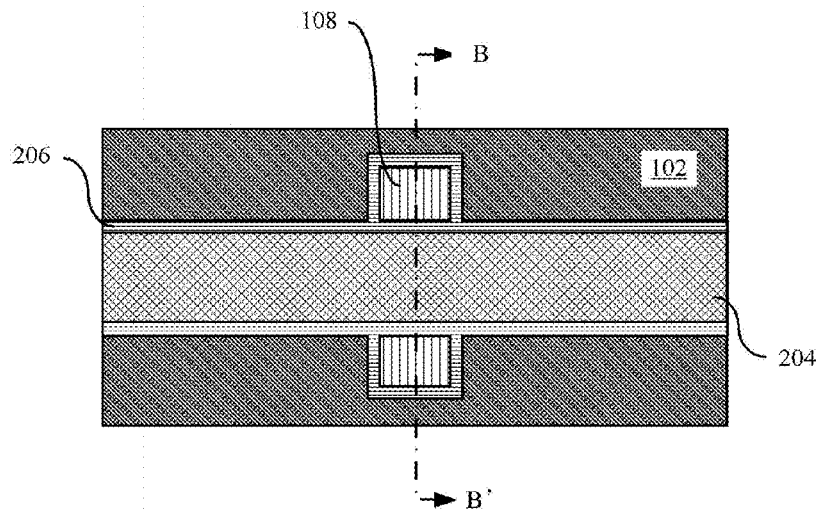
Figure 8C:
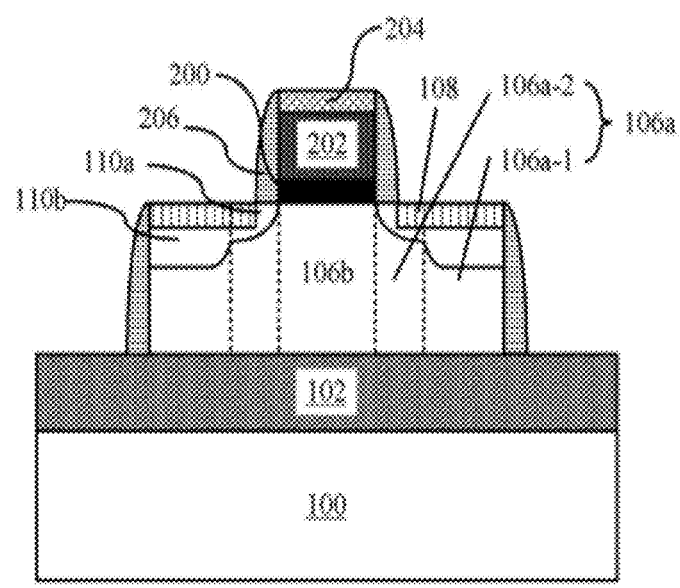
Figure 8D:
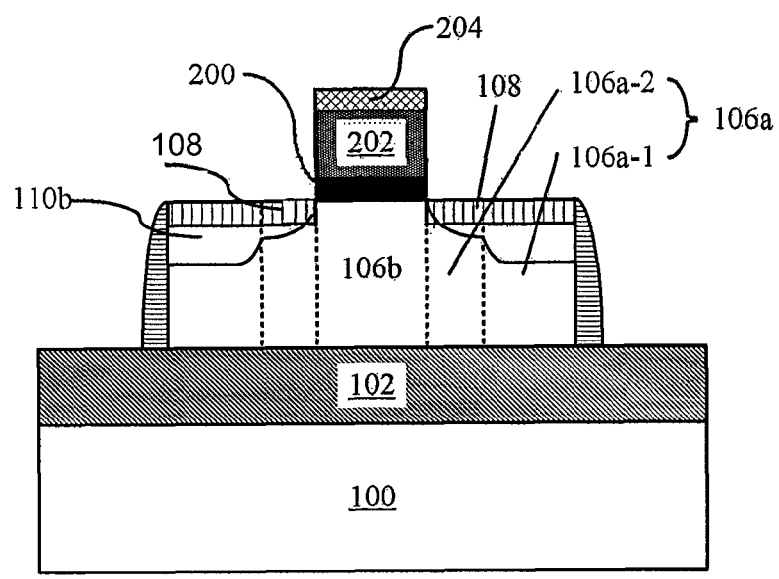

In FIG. 8(b), the upper and lower opposite sides of the channel portion 106b under the hard mask 204 are the first sides, and the left and right opposite sides of the channel portion 106b under the hard mask 204 are the second sides. It shall be noted that in a preferred solution, the first sides are substantially perpendicular to the second sides, and the term "substantially perpendicular" indicates the standard that can be achieved by the semiconductor technology is taken into account, that is, taking into account the error within a range allowable by the state of the art of semiconductor.

Compared with the conventional method of forming the source/drain extension regions 110a through ion implantation, the semiconductor structure provided by the present invention has the following two advantages: first, the area of the contact layer 108 is larger than that of the conventional contact layer, which enables the source/drain extension regions 110a to have a lower contact resistance, thus effectively improving the electrical conductivity of the semiconductor structure; second, by controlling the thickness of the metal layer that is used for forming the contact layer 108, the thickness of the contact layer 108 can be controlled, thus a thinner source/drain extension regions 110a is formed effectively to suppress the short channel effect. Wherein compared to the technology of forming thinner source/drain extension regions 110a by controlling the energy, angle, etc. of ion implantation, the technology of controlling the thickness of the metal layer is easier.

Preferably, the gate stack can be made by a material that does not react with the metal that forms the contact layer 108. In this case, the gate stack does not need to be particularly protected, and the spacers 206 can be removed completely to maximally expose the source/drain extension regions 110a and increase the area of the source/drain extension regions 110a that reacts with the metal layer, thereby further reducing the contact resistance of the source/drain extension regions 110a.

Preferably, the contact layer 108 is one of $CoSi_2$, NiSi and $Ni(Pt)Si_{2-y}$, or combinations thereof. When the contact layer 108 is made of the materials and has a thickness smaller than 7 nm, it has thermal stability and can maintain a lower resistance under a temperature as high as 850° C. In the subsequent semiconductor manufacturing process, the property of thermal stability of the contact layer 108 can enable it to maintain a low resistance at the temperature for high temperature annealing (e.g. 700° C.-800° C.), thereby maintaining the good performance of the semiconductor structure.

Wherein, with respect to the structure composition, material and formation method of each of the components in the embodiments of the semiconductor structure, they can be the same as those described in the embodiment of the manufacturing method for the semiconductor structure, so they are not elaborated any more.

Although the exemplary embodiments and the advantages thereof have been described in detail, it shall be understood that various changes, replacements and modifications can be made to the embodiments without departing from the spirit of the present invention and the protection scope defined by the attached claims. As for other examples, those skilled in the art will easily understand that the sequence of the process steps can be changed within the protection scope of the present invention.

In addition, the scope to which the present invention is applied is not limited to the process, mechanism, manufacture, material composition, means, methods and steps described in the specific embodiments in the specification. Those skilled in the art would readily appreciate from the disclosure of the present invention that the process, mechanism, manufacture, material composition, means, methods and steps currently existing or to be developed in future, which perform substantially the same functions or achieve substantially the same as that in the corresponding embodiments described in the present invention, may be applied according to the teaching of the present invention. Therefore, the claims attached to this invention intend to include the process, mechanism, manufacture, material composition, means, methods or steps in the protection scope thereof

What is claimed is:

1. A method for manufacturing a semiconductor structure, comprising:
    a) providing a substrate and forming a fin (106) on the substrate, wherein the fin (106) comprises a central portion (106b) for forming a channel and an end portion (106a) for forming a source/drain region and a source/drain extension region;
    b) forming a gate stack to cover the central portion (106b) of the fin (106), wherein the Si or metal of the gate in the gate stack does not react with the metal forming the contact layer (108);
    performing light doping to form a source/drain extension region (110a) in the end portion (106a) of the fin;
    forming a spacer (206) on sidewalls of the gate stack;
    performing heavy doping to form a source/drain region (110b) in the end portion (106a) of the fin;
    c) removing the spacer (206) completely to maximally expose the source/drain extension region (110a); and
    d) forming a contact layer (108) on upper surfaces of the source/drain region (110b) and all of the source/drain extension region (110a).

2. The method according to claim 1, wherein the step a) comprises:
    providing a substrate that comprises a first semiconductor layer (100), an insulating layer (102) on the first semiconductor layer (100) and a second semiconductor layer (104) on the insulating layer (102); and
    etching the second semiconductor layer (104) to form the fin (106).

3. The method according to claim 1, wherein the step of forming a gate stack comprises:
    forming a gate dielectric material layer on the fin (106) and the insulating layer (102), forming a gate material layer on the gate dielectric material layer, and forming a hard mask material layer on the gate material layer; and
    etching the hard mask material layer, the gate material layer and the gate dielectric material layer to expose the end portion (106a) of the fin (106) so as to form the gate stack.

4. The method according to claim 1, wherein the step d) comprises:
    depositing a metal layer to cover the source/drain region (110b) and the exposed area of the source/drain extension region (110a); and
    performing an annealing operation so that the metal layer react with the source/drain region (110b) and the exposed area of the source/drain extension region (110a) so as to form a contact layer (108).

5. The method according to claim 4, wherein the thickness of the metal layer is smaller than 3 nm.

6. The method according to claim 4, wherein the material of the metal layer is one of Co, Ni and NiPt, or combinations thereof.

7. The method according to claim 6, wherein if the material of the metal layer is NiPt, the content of Pt in NiPt is less than 5%.

8. The method according to claim 1, wherein the thickness of the contact layer (108) is smaller than 7 nm.

9. The method according to claim 8, wherein the contact layer (108) comprises one of $CoSi_2$, NiSi and $Ni(Pt)Si_{2-y}$, or combinations thereof.

10. The method according to claim 2, wherein the step d) comprises:
    depositing a metal layer to cover the source/drain region (110b) and the exposed area of the source/drain extension region (110a); and
    performing an annealing operation so that the metal layer react with the source/drain region (110b) and the exposed area of the source/drain extension region (110a) so as to form a contact layer (108).

11. The method according to claim 3, wherein the step d) comprises:
    depositing a metal layer to cover the source/drain region (110b) and the exposed area of the source/drain extension region (110a); and
    performing an annealing operation so that the metal layer react with the source/drain region (110b) and the exposed area of the source/drain extension region (110a) so as to form a contact layer (108).

12. The method according to claim 2, wherein the thickness of the contact layer (108) is smaller than 7 nm.

13. The method according to claim 3, wherein the thickness of the contact layer (108) is smaller than 7 nm.

* * * * *